United States Patent
Kim et al.

(10) Patent No.: US 6,319,654 B1
(45) Date of Patent: Nov. 20, 2001

(54) PROCESS FOR FORMING A PHOTORESIST PATTERN BY TOP SURFACE IMAGING PROCESS

(75) Inventors: Myoung Soo Kim; Jae Chang Jung; Hyung Gi Kim; Ki Ho Baik, all of Kyoungki-do (KR)

(73) Assignee: Hyundai Electronics Industries, Kyoungki-Do (KR)

( * ) Notice: Subject to any disclaimer, the term of this patent is extended or adjusted under 35 U.S.C. 154(b) by 0 days.

(21) Appl. No.: 09/566,290

(22) Filed: May 5, 2000

(30) Foreign Application Priority Data

May 6, 1999 (KR) .................................................. 99-16181

(51) Int. Cl.$^7$ ...................................................... G03F 7/40
(52) U.S. Cl. ........................ 430/296; 430/313; 430/317; 430/967; 430/18; 438/735
(58) Field of Search .................... 430/313, 317, 430/296; 438/735

(56) References Cited

U.S. PATENT DOCUMENTS 5,059,698  10/1991  Schulthess et al. .................. 549/375

(List continued on next page.)

FOREIGN PATENT DOCUMENTS 0 628 879 A1  12/1994  (EP) .

(List continued on next page.)

OTHER PUBLICATIONS

Takahashi: et al, CA 1995: 312 609; 122:147353 English Abstract of JP 06266101, File Caplus, ACS, Sep. 22, 1994.*

(List continued on next page.)

Primary Examiner—Cynthia Hamilton
(74) Attorney, Agent, or Firm—Townsend and Townsend and Crew, LLP

(57) ABSTRACT

The present invention relates to a process for forming a photoresist pattern by employing a silylation process, and particularly to a method for forming a photoresist pattern according to a top surface imaging (TSI) process using a photoresist composition comprising a cross-linker having a cross-linker monomer of the following Chemical Formula 1 or 2. The photoresist composition containing a polymer of the above cross-linker monomer is preferably used in a TSI process which has been optimized by controlling the conditions of each step, such as temperature and time, thereby obtaining an ultrafine pattern that can be more efficiently applied to a 4 G or 16 G DRAM semiconductor fabrication process:

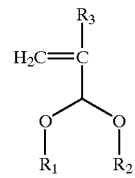

<Chemical Formula 1>

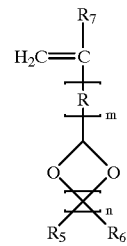

<Chemical Formula 2> wherein, $R_1$, $R_2$, $R_3$, $R_5$, $R_6$, $R_7$, R, m and n are as defined in the specification attached hereto.

17 Claims, 2 Drawing Sheets

U.S. PATENT DOCUMENTS

| | | | |
|---|---|---|---|
| 5,266,424 | | 11/1993 | Fujino et al. ............................ 430/5 |
| 5,356,758 | | 10/1994 | Orvek ................................... 430/322 |
| 5,366,852 | * | 11/1994 | Pavelchek et al. .................. 430/326 |
| 5,707,783 | * | 1/1998 | Stauffer et al. ..................... 430/313 |

FOREIGN PATENT DOCUMENTS

| | | |
|---|---|---|
| 0 889 367 A1 | 1/1999 | (EP) . |
| WO 99/61497 | 12/1999 | (WO) . |

OTHER PUBLICATIONS

U.S. application No. 09/448,916, Jung et al., filed Nov. 24, 1999.

U.S. application No. 09/448,964, Jung et al., filed Nov. 24, 1999.

U.S. application No. 09/501,096, Kong et al., filed Feb. 9, 2000.

* cited by examiner

PROCESS FOR FORMING A PHOTORESIST PATTERN BY TOP SURFACE IMAGING PROCESS

BACKGROUND OF THE INVENTION

1. Field of the Invention

The present invention relates to a process for forming a photoresist pattern using a photolithography process with a silylation step, and in particular to an improved process for forming a photoresist pattern that is optimized to form an ultrafine pattern. The preferred embodiment of the invention comprises employing a top surface imaging ("TSI") process, controlling process conditions such as temperature and time and employing a photoresist composition including cross-linking agents ("cross-linkers"). Preferably the cross-linker is a polymer of a cross-linking monomer represented by Chemical Formula 1 or 2 set forth below.

2. Description of the Background Art

The unique problems that may occur in forming an ultrafine pattern are pattern collapse in the developing step and deficiency of resolution. In addition, in the fabrication of a 4 G DRAM or 16 G DRAM semiconductor elements employing an ultrafine circuit below 100 nm, the photoresist layer should be thin in order to form a fine pattern. However, when the photoresist layer is thin, the etching process cannot be performed. Accordingly, the photoresist composition forming the layer must have etching resistance; however, it is difficult to enhance the etching resistance of a photoresist. Moreover, when the pattern is formed by employing DUV (Deep Ultra Violet) light, such as ArF and EUV, the pattern may be deformed by the energy of the optical system. As a result, there has been strong demand for a highly sensitive photoresist that can form a pattern at a weaker light energy level.

The only known process that overcomes the aforementioned disadvantages is a top surface imaging (TSI) process using silylation. However, even the TSI process does not make it possible to form an ultrafine pattern in the 4 G or 16 G DRAM semiconductor fabrication process employing the conventional KrF excimer laser and, as a result, ArF radiation is employed. When a photoresist for the TSI process using ArF is employed, it is possible to form the ultrafine pattern below 0.1 μm L/S.

Recently, chemical amplification-type DUV photoresists have proven to be useful to achieve high sensitivity in processes for preparing micro-circuits in the manufacture of semiconductors. These photoresists are prepared by blending a photoacid generator with polymer (sometimes referred to herein as "resin") matrix macromolecules having acid labile structures, and the composition is coated on a substrate.

According to the reaction mechanism of such a photoresist, the photoacid generator generates acid when it is illuminated by a patterned light source, and the main chain or branched chain of the resin is reacted with the generated acid to be decomposed or crosslinked. The polarity change of the resin induces solubility differences between the exposed portion and unexposed portion in the developing solution, to form the predetermined pattern on the substrate.

In the lithography process, resolution depends upon the wavelength of the light source—the shorter the wavelength, the smaller the pattern that can be formed. However, when the wavelength of the light source is decreased in order to form a micro pattern, it is disadvantageous in that the lens of the exposing device is deformed by the light source, thereby shortening its life.

Melamine, a conventional cross-linker, has only three functional groups to cross-link with acid. Further, a large amount of acid must be generated when melamine is used as a cross-linker, because acid is consumed by the cross-linking reaction. As a result, higher energy light-exposure is required for such cross-linking agents. In order to overcome the disadvantages described above, chemical amplification-type components that cross-link with a photoresist resin and use less amounts of energy are desired.

Furthermore, developing solution may be soaked into the cross-linked site so as to swell it up. Thus, in order to form a pattern of higher integrity, the incorporation of a stronger cross-linker is required.

The photoresist composition must also have heat resistance so as to endure post exposure baking and the silylation process, which are performed at high temperature in the TSI process.

In order to overcome the above-described disadvantages, the present inventors have optimized the process for forming an ultrafine photoresist pattern for 4 G or 16 G DRAM semiconductor elements, by employing a photoresist composition comprising a chemical amplification-type cross-linker, which overcomes the problems of conventional cross-linkers, and a photoresist resin, which includes a polyvinyl hydroxyl group for heat resistance.

SUMMARY OF THE INVENTION

Accordingly, an object of the present invention is to provide a process for forming an ultrafine pattern in the manufacture of 4 G DRAM or 16 G DRAM semiconductor elements, which comprises employing a chemical-amplification-type photoresist composition including a cross-linker.

In order to achieve the above-described object of the present invention, there is provided a method for forming a photoresist pattern which comprises employing a photoresist composition including a chemical amplification-type cross-linker which can be crosslinked with a photoresist resin at low energy to form a dense crosslinkage. Preferably, the process for forming an ultrafine pattern further comprises controlling conditions such as temperature and time of the soft baking, presilylation baking and silylation steps, and selecting a suitable silylation agent.

BRIEF DESCRIPTION OF THE DRAWINGS

The present invention will become better understood with reference to the accompanying drawings, which are given only by way of illustration and thus are not limiting of the present invention, wherein.

DETAILED DESCRIPTION OF THE PREFERRED EMBODIMENTS

Figure 1:
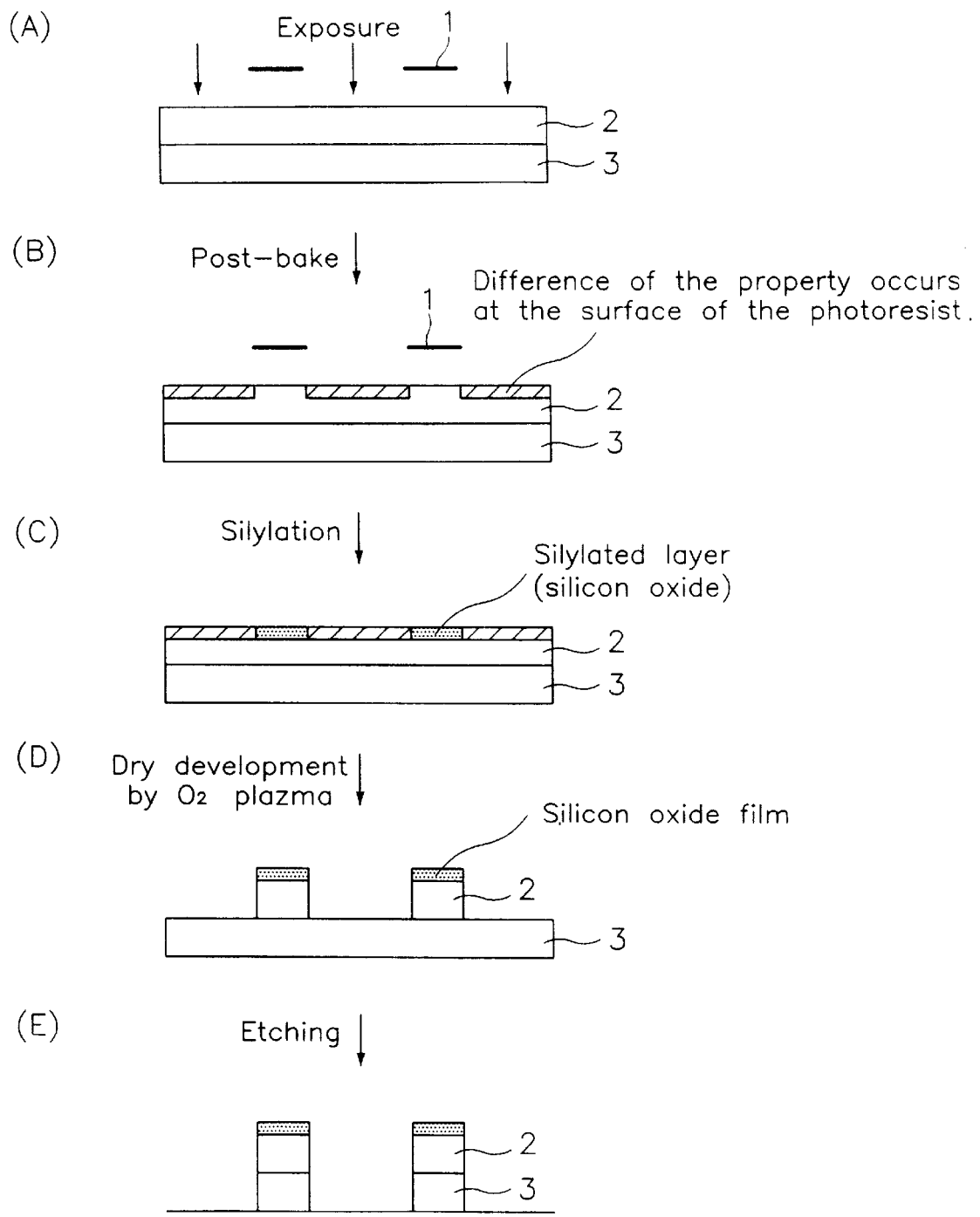
FIG. 1 is a schematic view illustrating a process for forming an ultrafine pattern by top surface imaging (TSI) process in accordance with the present invention.

A process for forming a photoresist pattern in accordance with the present invention will now be described in detail.

The process for forming the photoresist pattern comprises the steps of:

(a) preparing a chemical amplification-type photoresist composition comprising a cross-linker, a photoacid generator and a photoresist polymer in a suitable solvent;

(b) coating the photoresist composition on a substrate of a semiconductor element to form a photoresist film;

(c) exposing the photoresist film to light;

(d) performing a silylation process on the photoresist film to form a silicon oxide film pattern on the surface of the exposed photoresist film;

(e) developing the photoresist film to form a pattern thereon; and (f) etching the substrate using the silicon oxide film pattern as an etching mask;

wherein the cross-linker contained in the photoresist composition comprises a polymer (a homopolymer or a copolymer) of a cross-linker monomer selected from the group consisting of compounds represented by the following Chemical Formulas 1 and 2:

<Chemical Formula 1>

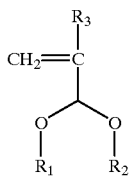

wherein, $R_1$ and $R_2$ individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$ represents hydrogen or methyl;

<Chemical Formula 2>

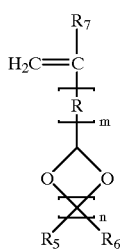

wherein, $R_5$, $R_6$ and R individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; $R_7$ represents hydrogen or methyl; m represents 0 or 1; and n represents a number of 1 to 5.

Preferably the cross-linker is selected from the group consisting of polymers having Chemical Formulas 3 to 8;

<Chemical Formula 3>

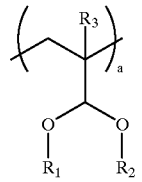

<Chemical Formula 4>

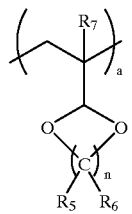

<Chemical Formula 5>

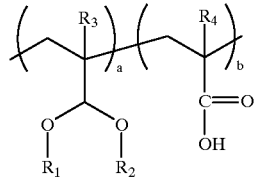

<Chemical Formula 6>

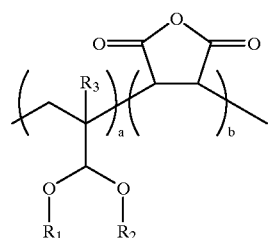

<Chemical Formula 7>

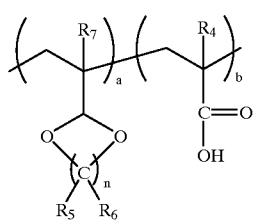

<Chemical Formula 8>

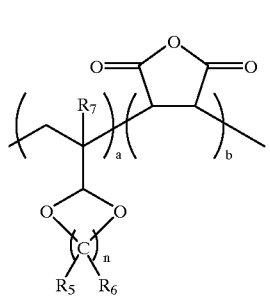

wherein, $R_1$, $R_2$, $R_3$, $R_5$, $R_6$, $R_7$ and n are as defined in Chemical Formulas 1 and 2; $R_4$ represents hydrogen or methyl; a and b individually represent relative amounts of each comonomer in the polymer.

In more detail, the cross-linker is preferably selected from the group consisting of compounds represented by the following Chemical Formulas 9 to 20:

<Chemical Formula 9>

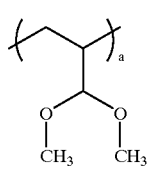

<Chemical Formula 10>

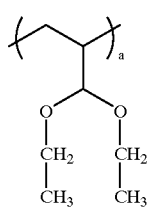

<Chemical Formula 11>

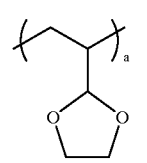

<Chemical Formula 12>

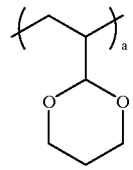

<Chemical Formula 13>

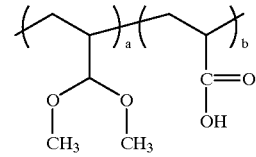

<Chemical Formula 14>

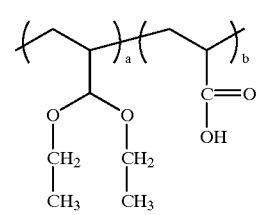

<Chemical Formula 15>

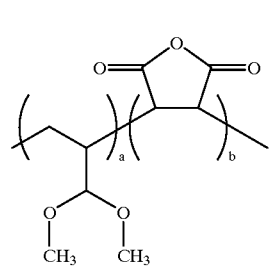

<Chemical Formula 16>

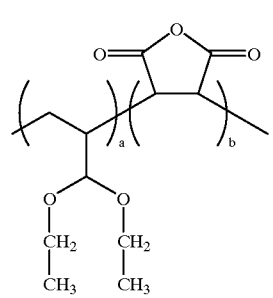

<Chemical Formula 17>

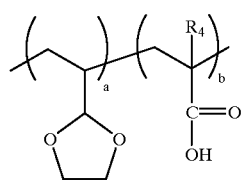

<Chemical Formula 18>

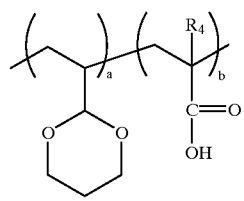

<Chemical Formula 19>

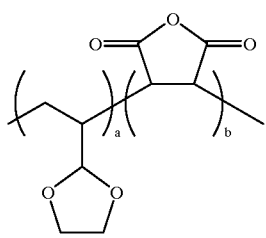

<Chemical Formula 20>

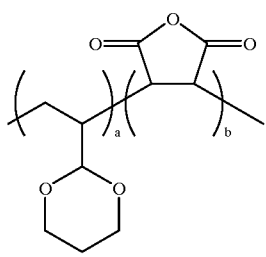

wherein, $R_4$ represents hydrogen or methyl.

Preferably, the ratio a:b=10–100 mol %: 0–90 mol % in Chemical Formulas 5, 7, 13, 14, 17 and 18 above; and a:b=10–90 mol %: 10–90 mol % in Chemical Formulas 6, 8, 15, 16, 19 and 20.

The reaction mechanism for the chemical amplification-type cross-linkers according to the present invention is described with reference to Reaction Schemes 1 and 2 shown below. The cross-linker of Chemical Formula 5 is used to illustrate Reaction Scheme 1; and the cross-linker of Chemical Formula 7 is used to illustrate Reaction Scheme 2.

First, a cross-linker according to the present invention is mixed with a photoresist resin and photoacid generator, and the mixture is coated on a conventional semi-conductor substrate (stage 1). Then, when a predetermined region of the substrate is exposed to light, the exposed portion generates acid (stage 2). Due to the acid generated from the exposed portion, the cross-linker of the present invention and the photoresist combine together. When the cross-linker of Chemical Formula 5 is used, more acid is generated as a result of such cross-linking and continuous chain cross-linking is carried out. When the cross-linker of Chemical Formula 7 is used, acid is regenerated after the cross-linkage and, at the same time, a cross-linkable hydroxyl group is regenerated on the cross-linker thereby enabling continuous chain cross-linking to be carried out (stage 3).

<Reaction Scheme 1>

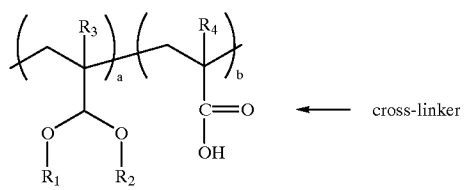
← cross-linker

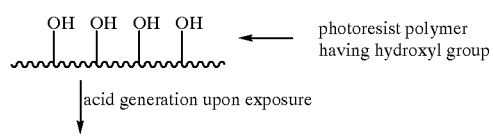
← photoresist polymer having hydroxyl group

↓ acid generation upon exposure

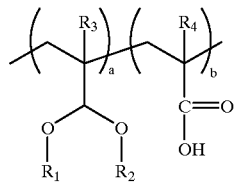

H⁺ ← acid

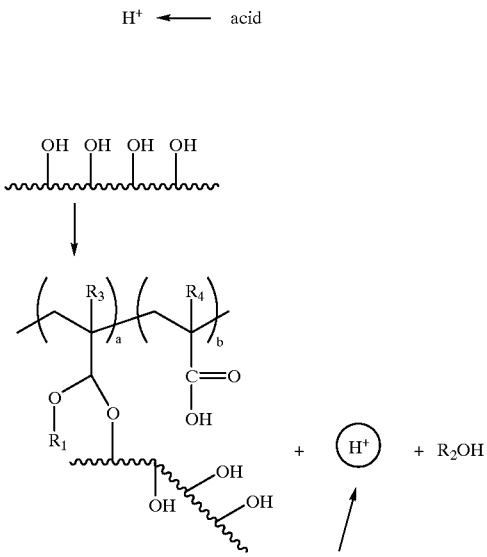

serves as a catalyst since acid is generated again after cross-linking (cross-linking of chemical amplification type)

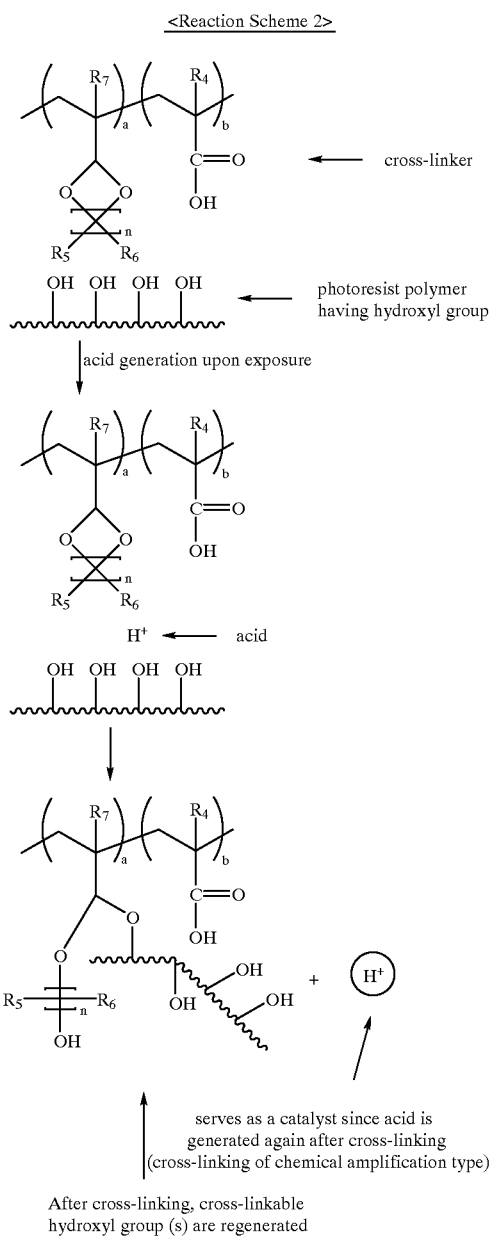

<Reaction Scheme 2>

After cross-linking, cross-linkable hydroxyl group (s) are regenerated

In the process for forming a pattern in accordance with the present invention, it is preferable to perform a soft baking process at 90° to 180° C. for 30 to 300 seconds after coating the photoresist composition in step (b) above, in order to remove the solvent used in the photoresist composition.

In addition, the exposure step (c) above is advantageously performed by using an ArF, KrF, EUV, E-beam and X-ray light source.

After exposure step (c), a presilylation baking step is preferably carried out at 90° to 250° C. for 30 to 300 seconds so as to cure the photoresist layer.

The silylation process of step (d) is performed at 90° to 250° C. for 30 to 300 seconds by using a liquid phase or gas phase silylation agent. The silylation agent is preferably selected from the group consisting of hexamethyl disilazane, tetramethyl disilazane, bisdimethylamino dimethylsilane, bisdimethylamino methylsilane, dimethylsilyl dimethylamine, dimethylsilyl diethylamine, trimethylsilyl dimethylamine, trimethylsilyl diethylamine and dimethylamino pentamethyldisilane.

Step (e) above preferably comprises:
(i) developing the photoresist film by performing dry development for 1 to 100 seconds with a mixture of gases comprising fluorine or chlorine and oxygen; and
(ii) dry developing the non-developed area in step (i) for 10 to 500 seconds with gas containing oxygen or carbon dioxide.

Step (f) above preferably comprises:
(iii) overetching the substrate by 10 to 80%.

The above-described steps will now be described with reference to FIG. 1. When the photoresist film 2 coated on the substrate 3 is exposed to light through patterned mask 1 (A), the photoresist polymer and the cross-linker of the present invention are crosslinked in the exposed area, thereby imparting different properties to the exposed area and the unexposed area at the surface of the photoresist layer (B). When the silylation process is performed thereon, the silylation agent and the photoresist polymer of the unexposed area react with each other, thereby forming a silicon oxide ($SiO_x$) film at the surface of the unexposed area (C). Thereafter, when the dry development step is carried out with $O_2$ plasma, etc., the $SiO_x$ layer functions as a barrier mask (D). The positive pattern is then formed by etching (E).

All polymers containing hydroxyl groups may be employed as the photoresist polymer of the present invention. However, it is preferable to use a homopolymer or copolymer of a hydroxy styrene monomer represented by Chemical Formula 21 because it has heat resistance to the post-exposure baking and the silylation process.

<Chemical Formula 21>

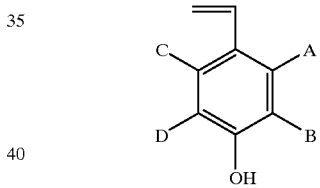

wherein, A, B, C and D individually represent hydrogen, chlorine, fluorine or methyl.

Polymers containing the monomer of Chemical Formula 21 are preferably selected from the group consisting of poly(hydroxy styrene); poly(dichloro hydroxy styrene); poly(hydroxy methylate hydroxy styrene); poly(hydroxy styrene/dichloro hydroxy styrene); and poly(hydroxy styrene/dichloro hydroxy styrene/hydroxy methylate hydroxy styrene).

In the photoresist composition of the present invention, a mixture ratio of the cross-linker to the photoresist polymer is advantageously 10–90 wt %: 10–90 wt %.

The pattern-forming process in accordance with the present invention can be employed to manufacture a semiconductor element.

The present invention will now be described in more detail by referring to examples below, but it should be noted that the present invention is not restricted to these examples.

I. Preparation of Photoresist Composition for Silylation

EXAMPLE 1

10 g of poly(hydroxy styrene), a photoresist polymer, and 6 g of poly(3,3'-dimethoxy propene), a chemical amplification-type cross-linker, were dissolved in 64 g of methyl 3-methoxypropionate solvent, and then 0.32 g of triphenylsulfonium triflate, a photoacid generator, was added to the resultant mixture. The resultant mixture was stirred and filtered through a 0.10 µm filter to provide a photoresist composition suitable for use in the silylation process of the present invention.

EXAMPLE 2

10 g of poly(hydroxy styrene/dichloro hydroxy styrene), a photoresist polymer, and 6 g of poly(3,3'-dimethoxy propene/acrylic acid), a chemical amplification-type cross-linker, were dissolved in 64 g of methyl 3-methoxypropionate solvent, and 0.32 g of triphenylsulfonium triflate, a photoacid generator was added to the resultant mixture. The resultant mixture was stirred and filtered through a 0.10 µm filter to provide a photoresist composition suitable for use in the silylation process of the present invention.

EXAMPLE 3

10 g of poly(hydroxy styrene/dichloro hydroxy styrene/hydroxy methylate hydroxy styrene), a photoresist polymer, and 6 g of poly(3,3'-diethoxy propene), a chemical amplification-type cross-linker, were dissolved in 64 g of methyl 3-methoxypropionate solvent, and 0.32 g of triphenylsulfonium triflate, a photoacid generator, was added to the resultant mixture. The resultant mixture was stirred and filtered through a 0.10 µm filter to provide a photoresist composition suitable for use in the silylation process of the present invention.

EXAMPLE 4

10 g of poly(hydroxy styrene), a photoresist polymer, and 6 g of poly(3,3'-diethoxy propene/acrylic acid), a chemical amplification-type cross-linker, were dissolved in 64 g of methyl 3-methoxypropionate solvent, and 0.32 g of triphenylsulfonium triflate, a photoacid generator, was added to the resultant mixture. The resultant mixture was stirred and filtered through a 0.10 µm filter to provide a photoresist composition suitable for use in the silylation process of the present invention.

EXAMPLE 5

10 g of poly(dichloro hydroxy styrene), a photoresist polymer, and 6 g of poly(1,3-dioxorane), a chemical amplification-type cross-linker, were dissolved in 64 g of methyl 3-methoxypropionate solvent, and 0.32 g of triphenylsulfonium triflate, a photoacid generator, was added to the resultant mixture. The resultant mixture was stirred and filtered through a 0.10 µm filter to provide the photoresist composition suitable for use in the silylation process of the present invention.

EXAMPLE 6

10 g of poly(hydroxy methylate hydroxy styrene) and 6 g of poly(1,3-dioxane) that is the chemical amplification-type cross-linker were dissolved in 64 g of methyl 3-methoxypropionate solvent, and 0.32 g of triphenylsulfonium triflate, a photoacid generator, was added to the resultant mixture. The resultant mixture was stirred and filtered through a 0.10 µm filter to provide a photoresist composition suitable for use in the silylation process of the present invention.

EXAMPLE 7

10 g of poly(hydroxy methylate hydroxy styrene), a photoresist polymer, and 6 g of poly(3,3'-dimethoxy propene/maleic anhydride), a chemical amplification-type cross-linker, were dissolved in 64 g of methyl 3-methoxypropionate solvent, and 0.32 g of triphenylsulfonium triflate, a photoacid generator was added to the resultant mixture. The resultant mixture was stirred and filtered through a 0.10 µm filter to provide a photoresist composition suitable for use in the silylation process of the present invention.

EXAMPLE 8

10 g of poly(hydroxy styrene), a photoresist polymer, and 6 g of poly(3,3'-dimethoxy propene/maleic anhydride), a chemical amplification-type cross-linker, were dissolved in 64 g of methyl 3-methoxypropionate solvent, and 0.32 g of triphenylsulfonium triflate, a photoacid generator, was added to the resultant mixture. The resultant mixture was stirred and filtered with 0.10 µm filter to provide a photoresist composition suitable for use in the silylation process of the present invention.

II. Process for Forming Ultrafine Pattern by Using Silylation Process

EXAMPLE 9

Figure 2:
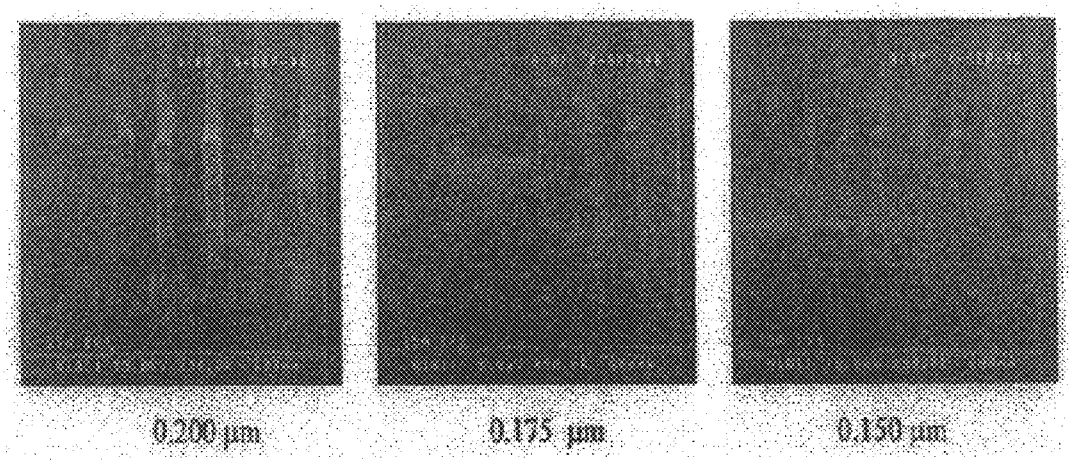
FIG. 2 shows a photoresist pattern obtained in Example 9 in accordance with the present invention.

The silylation photoresist composition prepared in Example 1 is coated on a substrate, soft-baked at 60° to 170° C. for 30 to 300 seconds to remove the solvent, and exposed to patterned light by employing an ArF laser exposer. Thereafter, a presilylation baking process is performed at 60° to 250° C. for 30 to 300 seconds in order to cure the photoresist and diffuse the acid, and the silylation process is carried out at 170° C. for 90 seconds by using tetramethyl disilazane as a silylation agent. Then, a silicon oxide layer is formed at the unexposed area by dry-development employing the mixture of gases comprising $C_2F_6$ or $CF_4$ gas, and $O_2$ gas. The mixture ratio of $C_2F_6$ or $CF_4$ gas to $O_2$ gas is 1:3 to 1:8. An ultrafine pattern was formed by dry etching the exposed area, which employs $O_2$ plasma and uses silicon oxide layer as a barrier mask (see FIG. 2).

EXAMPLES 10 to 16

The procedure according to Example 9 was repeated but using the photoresist composition obtained from Examples 2 to 8 individually instead of the photoresist composition obtain from Example 1, to form ultra-micro photoresist patterns.

As discussed earlier, the present invention overcomes the disadvantages of conventional chemical amplification-type photoresists by using a photoresist composition containing a chemical amplification-type cross-linker which can be crosslinked with a photoresist resin at low energy and which can form a dense crosslinkage; and containing a polymer having superior heat resistance. In the optimum process of the present invention, the conditions of each process, such as temperature and time of the soft baking, presilylation baking and silylation steps, are controlled and a suitable silylation agent is selected, thereby forming the ultrafine pattern.

What is claimed is:

1. A process for forming a photoresist pattern comprising the steps of:

(a) preparing a chemical amplification photoresist composition comprising a cross-linker, a photoacid generator and a photoresist polymer in a solvent;

(b) coating the photoresist composition on a substrate of a semiconductor element to form a photoresist film;

(c) exposing the photoresist film to light;

(d) performing a silylation process on the photoresist film to form a silicon oxide film pattern on the surface of the exposed photoresist film;

(e) developing the photoresist film to form a pattern thereon; and (f) etching the substrate using the silicon oxide film pattern as an etching mask;

wherein the cross-linker contained in the photoresist composition comprises at least one compound selected from the group consisting of monomers represented by the following Chemical Formulas 1 and 2 and polymers thereof:

<Chemical Formula 1>

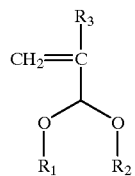

wherein, $R_1$ and $R_2$ individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$ represents hydrogen or methyl;

<Chemical Formula 2>

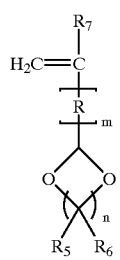

wherein,
R represents straight or branched $C_{1-10}$ alkylene optionally comprising a functional group selected from the group consisting of an ester, ketone, carboxylic acid, acetal, hydroxyl, and combinations thereof;

each of $R_5$ and $R_6$ is independently hydrogen, straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group;

$R_7$ represents hydrogen or methyl;

m represents 0 or 1; and n represents a number of 1 to 5.

2. The process according to claim 1, wherein the cross-linker is a homopolymer or copolymer of the monomer of Chemical Formula 1, or a homopolymer or copolymer of the monomer of Chemical Formula 2.

3. The process according to claim 2 wherein the cross-linker is selected from the group consisting of polymers represented by the following Chemical Formulas 3 to 8:

<Chemical Formula 3>

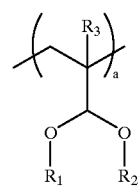

<Chemical Formula 4>

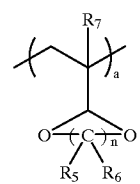

<Chemical Formula 5>

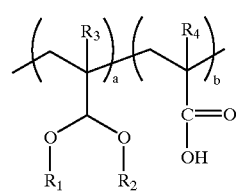

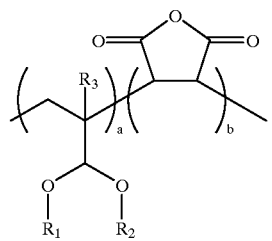

<Chemical Formula 6>

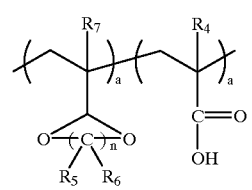

Chemical Formula 7

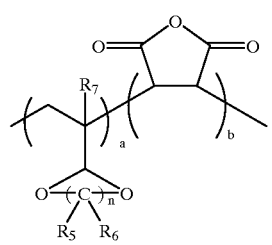

Chemical Formula 8 wherein, $R_4$ represents hydrogen or methyl; and a and b individually represent the relative amounts of each comonomer and each is a positive integer greater than 0.

4. The process according to claim 3, wherein a:b=10–90 mol %: 10–90 mol % in Chemical Formulas 5–8.

5. The process according to claim 3 wherein the cross-linker is selected from the group consisting of the compounds represented by following Chemical Formulas 9 to 20:

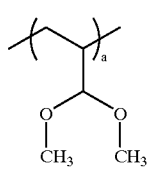

<Chemical Formula 9>

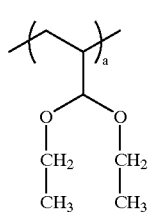

<Chemical Formula 10>

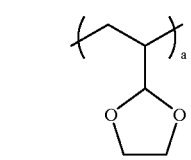

<Chemical Formula 11>

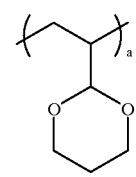

<Chemical Formula 12>

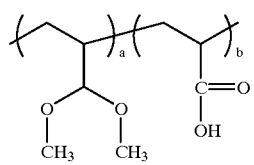

<Chemical Formula 13>

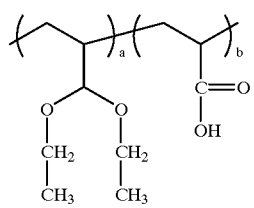

<Chemical Formula 14>

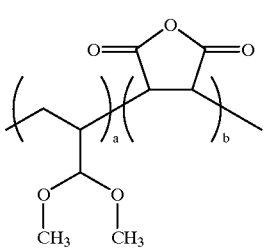

<Chemical Formula 15>

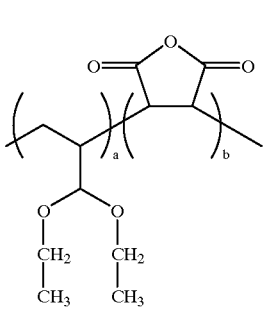

<Chemical Formula 16>

<Chemical Formula 17>

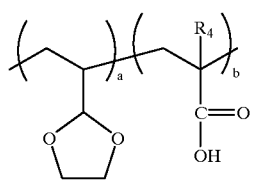

<Chemical Formula 18>

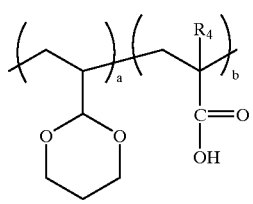

<Chemical Formula 19>

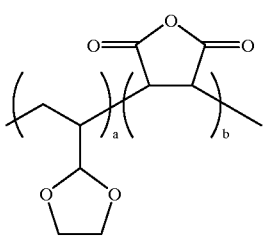

<Chemical Formula 20>

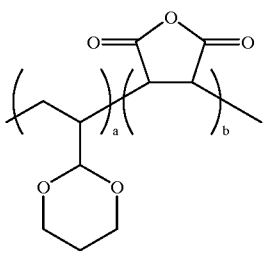

6. The process according to claim 5, wherein a:b=10–90 mol %: 10–90 mol %.

7. The process according to claim 1, firther comprising a soft baking step after step (b), performed at 90° to 180° C. for 30 to 300 seconds in order to remove the solvent.

8. The process according to claim 1, wherein step (c) is carried out by using a light source selected from the group consisting of ArF, KrF, EUV, E-beam and X-ray radiation.

9. The process according to claim 1, further comprising a presilylation baking step after step (c), performed at 90° to 250° C. for 30 to 300 seconds so as to cure the photoresist.

10. The process according to claim 1, wherein the silylation process of step (d) is performed by using a liquid phase or gas phase silylation agent at 90° to 250° C. for 30 to 300 seconds.

11. The process according to claim 10, wherein the silylation agent is selected from the group consisting of hexamethyl disilazane, tetramethyl disilazane, bisdimethylamino dimethylsilane, bisdimethylamino methylsilane, dimethylsilyl dimethylamine, dimethylsilyl diethylamine, trimethylsilyl dimethylamine, trimethylsilyl diethylamine and dimethylamino pentamethyldisilane.

12. The process according to claim 1, wherein the developing step (e) comprises:

(i) performing dry development for 1 to 100 seconds with a mixture of gases comprising (a) a fluorine-containing gas and oxygen; or (b) a chlorine-containing gas and oxygen; and (ii) performing dry development for 10 to 500 seconds with gas containing oxygen or carbon dioxide.

13. The process according to claim 1, wherein the photoresist polymer has a hydroxyl group.

14. The process according to claim 13, wherein the photoresist polymer is a homopolymer or copolymer of the monomer represented by following Chemical Formula 21:

<Chemical Formula 21>

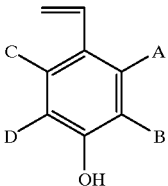

wherein, A, B, C and D individually represent hydrogen, chlorine, fluorine or methyl.

15. The process according to claim 14, wherein the polymer is selected from the group consisting of poly (hydroxy styrene); poly(dichloro hydroxy styrene); poly (hydroxy methylate hydroxy styrene); poly(hydroxy styrene/dichloro hydroxy styrene); and poly(hydroxy styrene/dichloro hydroxy styrene/hydroxy methylate hydroxy styrene).

16. The process according to claim 1, wherein the mixture ratio of the cross-linker to the photoresist polymer is 10–90 wt %: 10–90 wt %.

17. A semiconductor element manufactured by employing the process according to claim 1.

* * * * *